(12) United States Patent
Hara et al.

(10) Patent No.: US 8,711,134 B2
(45) Date of Patent: Apr. 29, 2014

(54) ORGANIC ELELECTROLUMINESCENT DISPLAY

(75) Inventors: Yujiro Hara, Kanagawa-ken (JP); Keiji Sugi, Kanagawa-ken (JP); Nobuyoshi Saito, Kanagawa-ken (JP); Tomio Ono, Kanagawa-ken (JP); Akio Amano, Tokyo (JP); Yukitami Mizuno, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 326 days.

(21) Appl. No.: 13/070,188

(22) Filed: Mar. 23, 2011

(65) Prior Publication Data

US 2012/0075278 A1    Mar. 29, 2012

(30) Foreign Application Priority Data

Sep. 24, 2010    (JP) ................ 2010-214423

(51) Int. Cl.
*G06F 3/038*    (2013.01)
*G09G 5/00*    (2006.01)

(52) U.S. Cl.
USPC ............................... 345/211; 345/76

(58) Field of Classification Search
USPC .................................. 345/76, 211
See application file for complete search history.

(56) References Cited

U.S. PATENT DOCUMENTS

| | | | |
|---|---|---|---|
| 6,919,681 B2* | 7/2005 | Cok et al. | 313/500 |
| 8,363,182 B2* | 1/2013 | Kamada | 349/68 |
| 2002/0186214 A1 | 12/2002 | Siwinski | |
| 2005/0225575 A1* | 10/2005 | Elliott et al. | 345/694 |
| 2007/0115221 A1* | 5/2007 | Buchhauser et al. | 345/76 |
| 2009/0066259 A1* | 3/2009 | Hwang et al. | 315/169.3 |

OTHER PUBLICATIONS

Margaret J. Helber, et al., "19.2: Color Filter Formulations for Full-Color OLED Displays: High Color Gamut Plus Improved Efficiency and Lifetime", 2007 SID International Symposium Digest of Technical Papers, vol. 36, 2007, pp. 1022-1025.
U.S. Appl. No. 14/045,133, filed Oct. 3, 2013, Ono, et al.

* cited by examiner

*Primary Examiner* — Kwang-Su Yang
(74) *Attorney, Agent, or Firm* — Oblon, Spivak, McClelland, Maier & Neustadt, L.L.P.

(57) ABSTRACT

According to one embodiment, an organic EL display includes a substrate and a pixel. The pixel is disposed on the substrate and includes a first color displaying portion and a second color displaying portion. The first color displaying portion has a first organic light emitting layer. The second color displaying portion has a second organic light emitting layer having an emission spectrum different from an emission spectrum of the first organic light emitting layer. The first color displaying portion has two sub-pixels. One of the two sub-pixels has a color filter.

3 Claims, 13 Drawing Sheets

ORGANIC ELELECTROLUMINESCENT DISPLAY

CROSS-REFERENCE TO RELATED APPLICATIONS

This application is based upon and claims the benefit of priority from the prior Japanese Patent Application No. 2010-214423, filed on Sep. 24, 2010; the entire contents of which are incorporated herein by reference.

FIELD

Embodiments described herein relate generally to an organic EL display.

BACKGROUND

In recent years, an organic EL (electroluminescent) display (OLED display) with an active matrix has been energetically developed. This is because the organic EL display has features such as high-speed response, high contrast, and thin shape.

In a color organic EL display, in order to develop three primary colors of RGB, each pixel formed in a matrix includes a red-displaying pixel displaying R, a green-displaying pixel displaying G, and a blue-displaying pixel displaying B.

Luminous efficiency of a conventional OLED display becomes low because it utilizes luminescence of sub-pixels of R and B, which are not efficient to display frequently appearing pale colors. Moreover, there is a problem for the conventional OLED display with a sub-pixel emitting a white color. Even though luminescence from the W sub-pixel having a high efficiency is utilized to display colors other than the white color, it is necessary to compensate remaining colors with other sub-pixels having a color filter, resulting in a low luminous efficiency for the remaining colors.

Moreover, there is also a problem in which the luminous efficiency decreases with time because it is necessary to increase current flowing in a light emitting layer when having a bright display using a pixel having low luminous efficiency.

DETAILED DESCRIPTION

In general, according to one embodiment, an organic EL display includes a substrate and a pixel. The pixel is disposed on the substrate and includes a first color displaying portion and a second color displaying portion. The first color displaying portion has a first organic light emitting layer. The second color displaying portion has a second organic light emitting layer having an emission spectrum different from an emission spectrum of the first organic light emitting layer. The first color displaying portion has two sub-pixels. One of the two sub-pixels has a color filter.

Hereinafter, with reference to the drawings, examples of the invention will be described in detail.

First Embodiment

Figure 1:
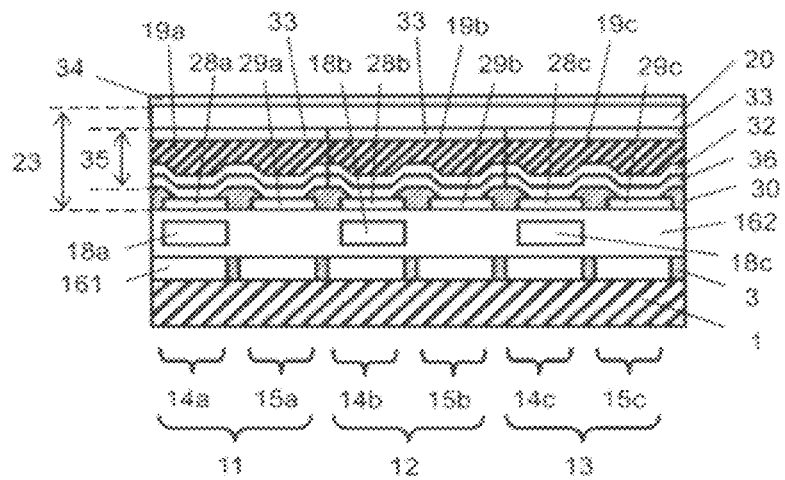
FIG. 1 is a partial cross-sectional view of an organic EL display according to a first embodiment.
Figure 2:
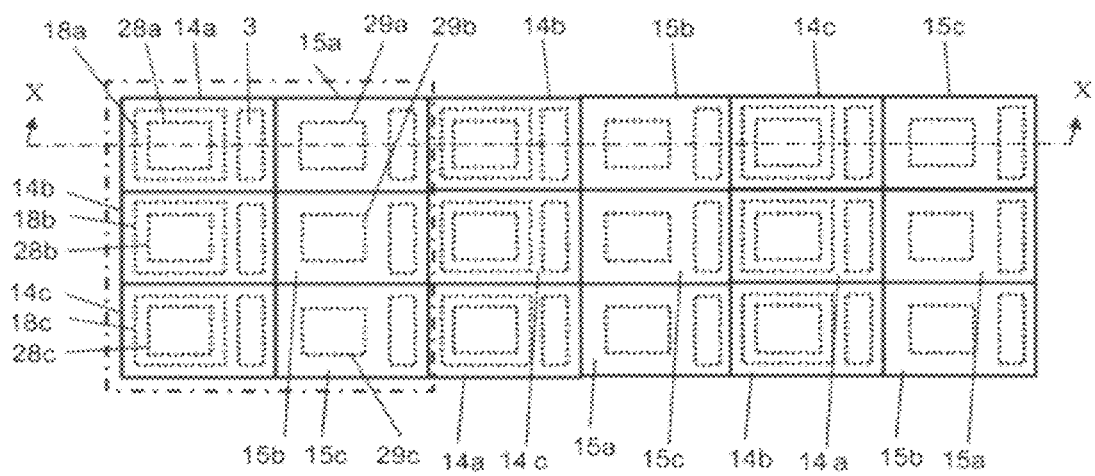
FIG. 2 is a partial plan view of the organic EL display according to the first embodiment.

In an organic EL display according to a first embodiment, which is combined with active-matrix thin film transistors (TFTs), a plurality of pixels is arranged in a matrix. A partial cross-sectional view and a plan view of the organic EL display are illustrated in FIG. 1 and FIG. 2, respectively. In FIG. 2, the inner side of an area surrounded by one-point dashed lines represents one pixel. FIG. 1 is a cross-sectional view along line X-X of FIG. 2. This organic EL display is a bottom emission type display emitting light from the side of a substrate.

On a transparent insulating substrate 1, pixels are formed in a matrix by a thin film transistor (TFT) array. Each pixel includes a red-displaying portion 11, a green-displaying portion 12, and a blue-displaying portion 13, and each of the red-displaying portion 11, the green-displaying portion 12, and the blue-displaying portion 13 includes two sub-pixels. The red-displaying portion 11 has a first red-displaying sub-pixel 14a and a second red-displaying sub-pixel 15a. The green-displaying portion 12 has a first green-displaying sub-pixel 14b and a second green-displaying sub-pixel 15b. The blue-displaying portion 13 has a first blue-displaying sub-pixel 14c and a second blue-displaying sub-pixel 15c. That is, in the example, one pixel includes six sub-pixels.

On the substrate 1, one pixel circuit 3 is formed in each sub-pixel. In each of a first red-displaying sub-pixel 14a, a first green-displaying sub-pixel 14b and a first blue-displaying sub-pixel 14c, a first planarization layer 161 is provided on the pixel circuit 3, and color filters 18a, 18b and 18c mainly transmitting red light, green light and blue light, respectively, are provided on the first planarization layer 161. A second planarization layer 162 is provided among the color filters 18a, 18b and 18c and on the upper surfaces thereof. An organic EL structure 23 is formed on the second planarization layer 162 of the first red-displaying sub-pixel 14a, the second red-displaying sub-pixel 15a, the first green-displaying sub-pixel 14b, the second green-displaying sub-pixel 15b, the first blue-displaying sub-pixel 14c, and the second blue-displaying sub-pixel 15c. That is, pixel electrodes 28a, 29a, 28b, 29b, 28c, and 29c, an organic EL layer 35, and a cathode electrode 20 are disposed from a side nearer to the planarization layer 162. Banks 30 are provided between each of the pixel electrodes 28a, 29a, 28b, 29b, 28c, and 29c.

The organic EL layer 35 is formed on the pixel electrodes 28a, 29a, 28b, 29b, 28c, and 29c, and the banks 30. The organic EL layer 35 is formed by stacking a hole-injection layer 36, a hole-transport layer 32, organic light emitting layers 19a, 19b, and 19c, and an electron-transport layer 33 from a side nearer to the substrate 1. On the hole-transport layer 32 of the red-displaying portion 11, the organic light emitting layer 19a with a first emission spectrum mainly containing red light is provided. On the hole-transport layer 32 of the green-displaying portion 12, the organic light emitting layer 19b with a second emission spectrum mainly containing green light is provided. On the hole-transport layer 32 of the blue-displaying portion 13, the organic light emitting layer 19c with a third emission spectrum mainly containing blue light is provided.

The cathode electrode 20 is provided on the electron-transport layer 33, and a protective film 34 is provided on the cathode electrode 20.

Figure 3:
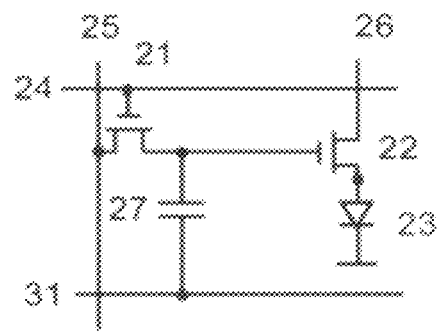
FIG. 3 is an equivalent circuit diagram of a sub-pixel of the organic EL display according to the first embodiment.

The equivalent circuit diagram of the pixel circuit 3 of a sub-pixel is illustrated in FIG. 3. On the substrate 1, a scanning line 24 for driving a switching TFT, a signal line 25 for applying a display signal, a VDD power-supply line 26 for supplying current to the OLED, and a storage capacitor line 31 are formed. In one sub-pixel, a storage capacitor 27, a switching TFT 21 for writing the display signal in the storage capacitor 27, the organic EL structure 23, and a driving TFT 22 connected in series with the organic EL structure 23 and controlling the amount of current flowing in the organic EL structure 23 are formed. Although a circuit configuration including two TFTs in one sub-pixel is described here, a circuit including three or more TFTs may be used.

An example of method for manufacturing an organic EL display having such pixels will be described. First, the above-mentioned pixel circuit 3 is formed on the substrate. The scanning line 24, the signal line 25, the VDD power-supply line 26, the storage capacitor line 31, the switching TFT 21 and the driving TFT 22 can be formed at the same time. As the insulating substrate 1, an alkali-free-glass substrate and a plastic film of, such as polyethylenenaphthalate (PEN), may be used. Moreover, as for the TFTs, materials, such as low-temperature polysilicon, amorphous silicon, and an oxide semiconductor, may be used for a channel layer, but the materials are not limited thereto. On the pixel circuit 3, the first planarization layer 161 made of a transparent resin is formed in advance to make the upper surface flat.

Subsequently, the red color filter 18a, the green color filter 18b and the blue color filter 18c are formed one by one in the first red-displaying sub-pixel 14a, the first green-displaying sub-pixel 14b, and the first blue-displaying sub-pixel 14c, respectively, by a photolithography process. For the color filters, a resin containing a pigment or a photosensitive material corresponding to a transmission spectrum may be used, and the color filters are formed to have a film thickness of 1 to 2 μm. At that time, none of the color filters is formed in the second red-displaying sub-pixel 15a, the second green-displaying sub-pixel 15b, and the second blue-displaying sub-pixel 15c.

Subsequently, the second planarization layer 162 made of a transparent organic resin is formed on the whole surface, and the unevenness of the substrate surface generated due to formation of the color filters is planarized. A planarization layer is also provided on the second red-displaying sub-pixel 15a, the second green-displaying sub-pixel 15b, and the second blue-displaying sub-pixel 15c. At that time, the heights of the six sub-pixels are equivalent.

Subsequently, the pixel electrodes 28a, 29a, 28b, 29b, 28c, and 29c each made of a transparent conductive film are formed in all of the sub-pixels, respectively. The pixel electrodes 28a, 29a, 28b, 29b, 28c, and 29c function as the anode electrodes of the organic EL structure 23, and they are formed of a film, such as an ITO film, an ITO/silver/ITO stacked film with a film thickness of about 100 nm. The pixel electrode 28a of the first red-displaying sub-pixel 14a, the pixel electrode 28b of the first green-displaying sub-pixel 14b, and the pixel electrode 28c of the first blue-displaying sub-pixel 14c are arranged so as to overlap with the red color filter 18a, the green color filter 18b, and the blue color filter 18c, respectively.

Subsequently, the banks 30 are formed between each of the pixel electrodes 28a, 29a, 28b, 29b, 28c, and 29c. For the banks 30, resins, such as polyimide and acrylic, may be used, and they can be formed of a photosensitive material to have a film thickness of about 0.2 to 2 μm by the photolithography process.

Subsequently, in the first red-displaying sub-pixel 14a and the second red-displaying sub-pixel 15a, the hole-injection layer 36, the hole-transport layer 32, the organic light emitting layer 19a with the first emission spectrum, and the electron-transport layer 33 are formed one by one. As the formation method, mask deposition and printing by ink-jetting can be used. As materials for the hole-injection layer 36, the hole-transport layer 32, and the electron-transport layer 34, materials such as DNTPD (N,N'-[p-di(m-tolyl) aminophenyl]-N,N'-diphenyl bendizine), and F4-TCNQ, materials such as NPB (Napthylphenylbiphenyl), and TPD derivative ([{(Ph-Ph) 2N-Ph-}2]), a material such as Alq3 may be used, respectively, but the materials are not limited thereto. If necessary, an electron-injection layer may be formed on the electron-transport layer 33. Moreover, as an organic light emitting material forming the organic light emitting layer 19a with the first emission spectrum, a material is used in which a dopant material is dispersed in a host material. For example, a dopant material, such as diphenylquinoxaline-Iridium compound, and a host material, such as Alq3 (Tris-(8-hydroxyquinoline) aluminum), may be used, but the materials are not limited thereto. In the first green-displaying sub-pixel 14b, the second green-displaying sub-pixel 15b, the first blue-displaying sub-pixel 14c, and the second blue-displaying sub-pixel 15c, the hole-injection layer 36, the hole-transport layer 32, the organic light emitting layer, and the electron-transport layer 33 are stacked in the same manner. As an organic light emitting layer to be provided in the first green-displaying sub-pixel 14b and the second green-displaying sub-pixel 15b, the organic light emitting layer 19b with the second emission spectrum is formed.

The organic light emitting layer 19c with the third emission spectrum is formed in the first blue-displaying sub-pixel 14c and the second blue-displaying sub-pixel 15c. As for the organic light emitting layer 19b with the second emission spectrum, it can be formed with an organic light emitting material using a dopant material, such as fac-tris (2-phenylpyridine) iridium complex (Ir(ppy)$_3$), and a host material, such as 4,4',4''-tris(N-carbazolyl)-triphenyl-amine (TCTA), 4,4'-(N-carbazolyl)-biphenyl (CBP). As for the organic light emitting layer 19c with the third emission spectrum, it can be formed with an organic light emitting material using a dopant material, such as iridium(III) bis[(4,6-di-fluorophenyl)-pyridinate-N and C$^{2'}$] picolinate (Flrpic), and a host material, such as 2,2'-bis(4-carbazolylphenyl)-1,1'-biphenyl (4CZ-PBP). The materials of the organic light emitting layers 19a, 19b and 19c are not limited thereto.

Furthermore, the cathode electrode 20 is formed so as to cover the electron-transport layer 33. As the material for the cathode electrode 20, a material, such as magnesium-silver alloy, may be used. Furthermore, the protective film 34 is formed so as to cover the whole. In this manner, a bottom emission type organic EL display can be formed.

Figure 4A:
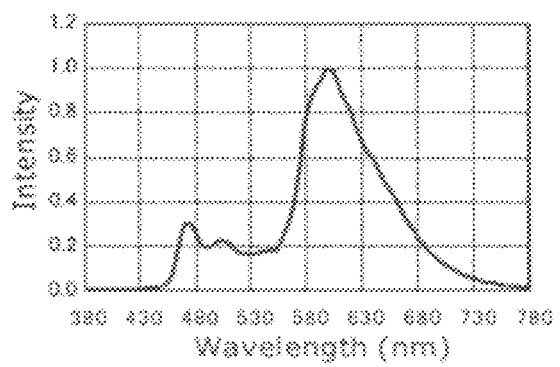
FIGS. 4A to 4C illustrate the light emission spectra of organic light emitting layers of the organic EL display according to the first embodiment.
Figure 4B:
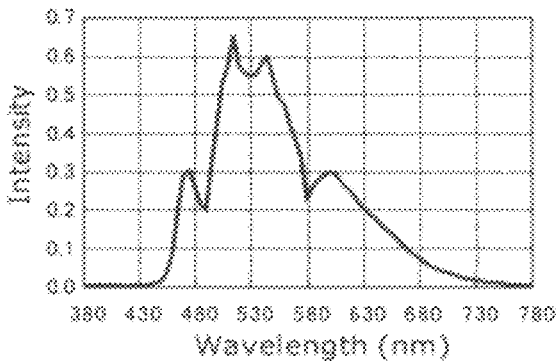
Figure 4C:
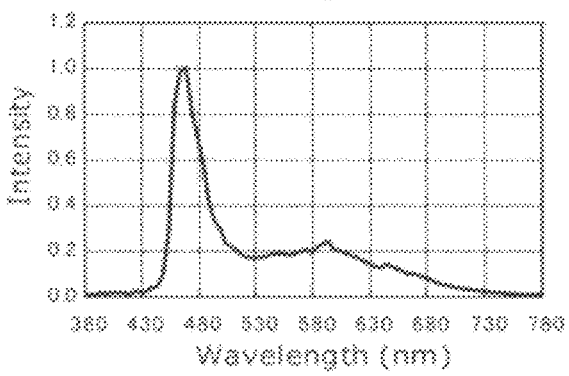
Figure 5:
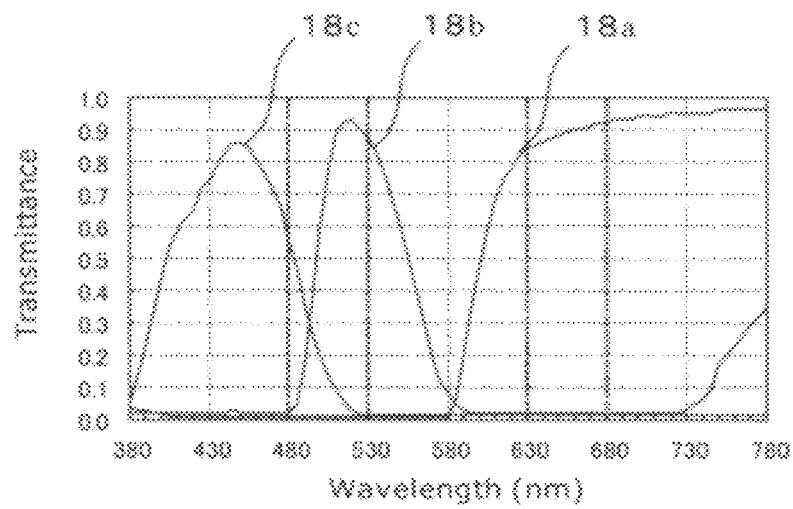
FIG. 5 illustrates the transmission spectra of color filters of the organic EL display according to the first embodiment.

Here, the light emission spectra of the organic light emitting layers 19a, 19b, and 19c are illustrated in FIGS. 4A to 4C, and the transmission spectra of the color filters 18a, 18b, and 18c are illustrated in FIG. 5. The first emission spectrum of the organic light emitting layer 19a is illustrated in FIG. 4A, the second emission spectrum of the organic light emitting layer 19b is illustrated in FIG. 4B, and the third emission spectrum of the organic light emitting layer 19c is illustrated in FIG. 4C. The scales of the vertical axes of the figures are the same.

Figure 7:
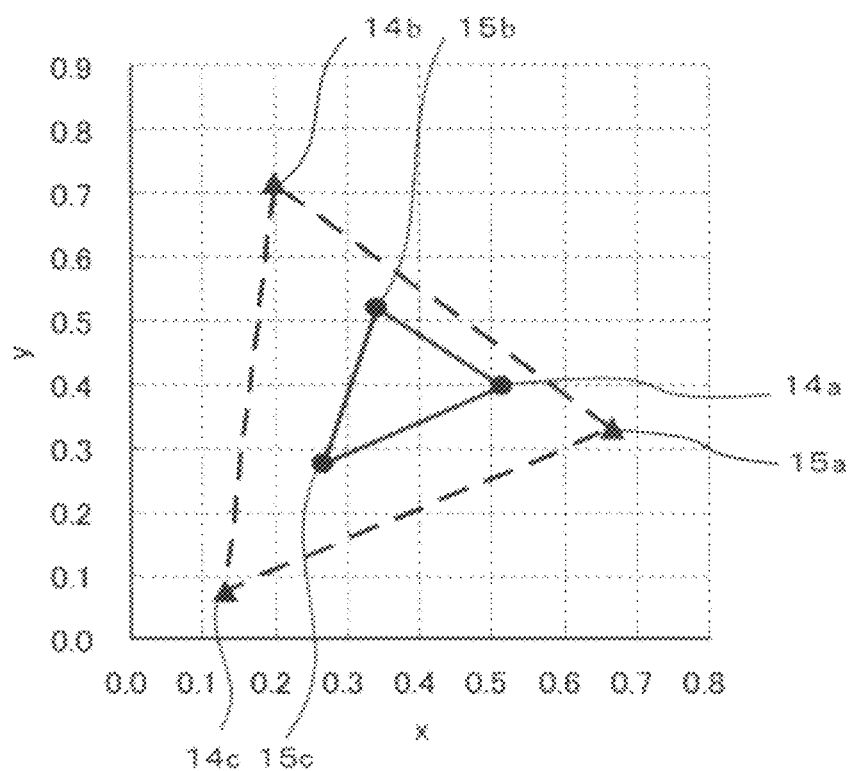
FIG. 7 illustrates the coordinate of the light spectrum from each of the sub-pixels of the organic EL display according to the first embodiment in a CIE1931xy chromaticity diagram.

Because there is no color filter in the second red-displaying sub-pixel 15a, the second green-displaying sub-pixel 15b, and the second blue-displaying sub-pixel 15c, luminescence from the three sub-pixels is determined by the first emission spectrum, the second emission spectrum, and the third emission spectrum, respectively. FIG. 7 is a CIE1931xy chromaticity diagram. The coordinates of the peak wavelengths of the first emission spectrum, the second emission spectrum, and the third emission spectrum, indicate points 15a, 15b and 15c each surrounded by a circle as illustrated in FIG. 7, respectively. The range surrounded by a triangle made by connecting the three points and illustrated by a solid line can be displayed only by combination of luminescence from the second red-displaying sub-pixel 15a, the second green-displaying sub-pixel 15b, and the second blue-displaying sub-pixel 15c, each having no color filter. For this reason, reduction in light use efficiency due to the color filters does not arise in the display of pale colors in this region.

Figure 6:
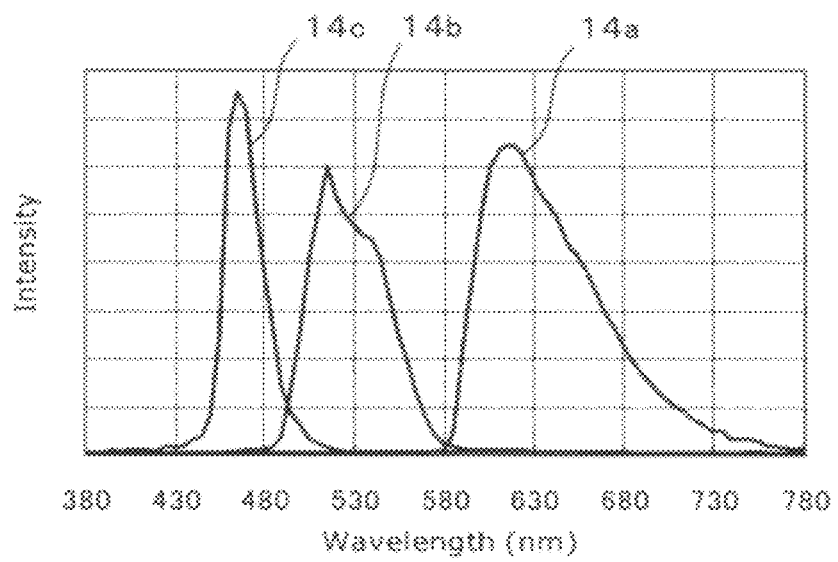
FIG. 6 illustrates the light spectra of the organic EL display according to the first embodiment transmitted a first red-displaying sub-pixel, a first green-displaying sub-pixel, and a first blue-displaying sub-pixel.

On the other hand, the first red-displaying sub-pixel 14a, the first green-displaying sub-pixel 14b, and the first blue-displaying sub-pixel 14c use light of the first emission spectrum, light of the second emission spectrum and light of the third emission spectrum, after transmitted by each color filter, respectively, and the spectra are illustrated in FIG. 6. The coordinates of the spectra indicate points 14a, 14b and 14c illustrated in FIG. 7 each surrounded by a triangle, respectively. The size of a triangle made by connecting the three points and illustrated by a dashed line is larger than that of the triangle illustrated by a solid line. As for display colors of deep colors present outside the triangle illustrated by a solid line and present inside the triangle illustrated by a dotted line, colors may be reproduced by utilizing luminescence from the first red-displaying sub-pixel 14a, the first green-displaying sub-pixel 14b and the first blue-displaying sub-pixel 14c, and thereby a large color reproduction range can be achieved.

By adopting such a structure, when displaying a pale color, it is possible to combine efficient luminescence from a plurality of light emitting layers each having an emission spectrum with different color coordinates, and thereby decrease in the light use efficiency due to color filters does not arise. Moreover, since a large color reproduction range can be achieved by using the sub-pixels combined with each color filter, it is also possible to display a deep color. When displaying contents in which generation frequency of a white color or pale colors is high and deep colors are also contained, the pale colors can be displayed in a high efficiency, enabling to reduce power consumption in a display in which many pale colors are displayed. Moreover, since the amount of current for displaying the same luminosity can be reduced, a degradation phenomenon of the organic EL layer 35 in which the luminous efficiency decreases with time can be suppressed.

The embodiment is mere an example, and the scope of the invention is not limited thereto. The drawings are schematic or conceptional ones, and relation between the thickness and the width of each portion and ratio between the sizes of each portion are not necessarily to scale. Moreover, even if the same portion is illustrated in the drawings, in some cases, the size and the ratio may be illustrated differently between the drawings. Moreover, in the example, although the color filters are provided between the substrate and the pixel electrode, they may be provided on the organic light emitting layer.

Second Embodiment

Figure 8:
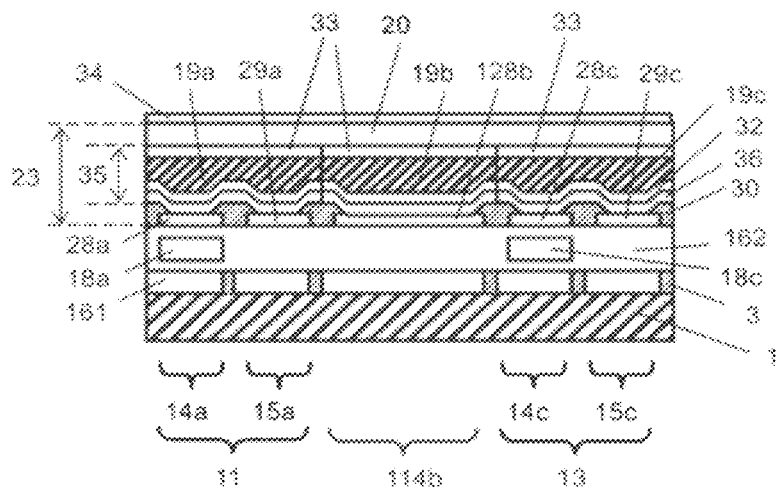
FIG. 8 is a partial cross-sectional view of an organic EL display according to a second embodiment.
Figure 9:
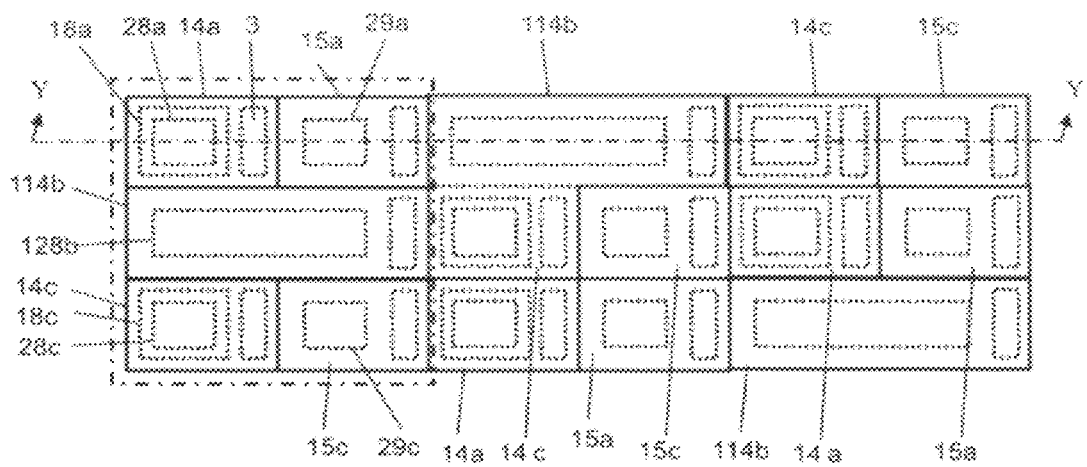
FIG. 9 is a partial plan view of the organic EL display according to the second embodiment.

Next, with reference to the drawings, an organic EL display according to a second embodiment will be described. In the organic EL display of this embodiment, a plurality of pixels is arranged in a matrix, and one pixel includes five sub-pixels. A partial cross-sectional view and a plan view of the organic EL display are illustrated in FIG. 8 and FIG. 9, respectively. FIG. 8 is a cross-sectional view along line Y-Y of FIG. 9.

On a transparent insulating substrate 1, a thin film transistor (TFT) array in which pixels are formed in a matrix is formed. As the insulating substrate 1, an alkali-free-glass substrate and a plastic film of, such as polyethylenenaphthalate (PEN), may be used. Moreover, as for the TFTs, materials, such as low-temperature polysilicon, amorphous silicon, and an oxide semiconductor, may be used for a channel layer, but the materials are not limited thereto. Each pixel includes a red-displaying portion 11 having a first red-displaying sub-pixel 14a and a second red-displaying sub-pixel 15a, a green-displaying sub-pixel 114b that is a green-displaying portion, and a blue-displaying portion 13 having a first blue-displaying sub-pixel 14c and a second blue-displaying sub-pixel 15c. Although each of the red-displaying portion 11 and the blue-displaying portion 13 includes two sub-pixels, the green-displaying portion having a high luminous efficiency is not divided.

In the upper layer of the first red-displaying sub-pixel 14a, a color filter 18a mainly transmitting red light is provided. In the upper layer of the first blue-displaying sub-pixel 14c, a color filter 18c mainly transmitting blue light is provided. In the upper layer of the green-displaying sub-pixel 114b, no color filter is provided. Other configurations are the same as those in the first embodiment.

The equivalent circuit diagram of a pixel circuit 3 is illustrated in FIG. 3. In one sub-pixel, a storage capacitor 27, a switching TFT 21 for writing a display signal in the storage capacitor 27, an organic EL structure 23, and a driving TFT 22 connected in series with the organic EL structure 23 and controlling the amount of current flowing into the organic EL structure 23 are formed.

An organic EL display having such pixels can be manufactured as follows, for example. That is, the pixel circuit 3 as mentioned above is formed on the substrate. On the pixel circuit 3, a first planarization layer 161 made of a transparent resin is formed to make the upper surface flat.

After that, the red color filter 18a and the blue color filter 18c are formed one by one in the first red-displaying sub-pixel 14a and the first blue-displaying sub-pixel 14c, respectively, by a photolithography process. For each of the color filters 18a and 18c, a resin containing a pigment or a photosensitive material corresponding to its transmission spectrum may be used, and it is formed to have a film thickness of 1 to 2 μm. At that time, none of the color filters is formed in the second red-displaying sub-pixel 15a, the green-displaying sub-pixel 114b, and the second blue-displaying sub-pixel 15c.

Subsequently, the second planarization layer 162 made of a transparent organic resin is formed on the whole surface, and the unevenness of the substrate surface generated due to formation of the color filters is planarized. The second planarization layer 162 is also formed on the second red-displaying sub-pixel 15a, the green-displaying sub-pixel 114b, and the second blue-displaying sub-pixel 15c.

Subsequently, the pixel electrodes 28a, 29a, 128b, 28c, and 29c each made of a transparent electric conductive film are formed in all of the sub-pixels. The pixel electrodes 28a, 29a, 128b, 28c, and 29c function as the anode electrodes of the organic EL structure 23, and they may be formed of a film, such as an ITO film, an ITO/silver/ITO stacked film with a film thickness of about 100 nm. The pixel electrode 28a of the first red-displaying sub-pixel 14a and the pixel electrode 28c of the first blue-displaying sub-pixel 14c are arranged so as to overlap with the red color filter 18a and the blue color filter 18c, respectively.

Subsequently, the banks 30 are formed so as to cover the end portions of the pixel electrodes 28a, 29a, 128b, 28c, and 29c. For the banks 30, resins, such as polyimide and acrylic, may be used, and they can be formed of a photosensitive material to have a film thickness of about 0.2 to 2 μm by the photolithography process.

Subsequently, in the first red-displaying sub-pixel 14a and the second red-displaying sub-pixel 15a, the hole-injection layer 36, the hole-transport layer 32, the organic light emitting layer 19a with the first emission spectrum, and the electron-transport layer 33 are formed one by one. As the formation method, mask deposition and printing by ink-jetting can be used. As materials for the hole-injection layer 36, the hole-transport layer 32, and the electron-transport layer 34, materials such as DNTPD (N,N'-[p-di(m-tolyl) aminophenyl]-N,N'-diphenyl bendizine), and F4-TCNQ, materials such as NPB (Napthylphenylbiphenyl), and TPD derivative ([{(Ph-Ph) 2N-Ph-}2]), a material such as Alq3 may be used, respectively, but the materials are not limited thereto. If necessary, an electron-injection layer may be formed on the electron-transport layer. In the green-displaying sub-pixel 114b and the blue-displaying portion 13, the hole-injection layer 36, the hole-transport layer 32, the organic light emitting layer, and the electron-transport layer 33 are stacked in the same manner. As an organic light emitting layer to be provided in the green-displaying sub-pixel 114b, the organic light emitting layer 19b with the second emission spectrum is used. As an organic light emitting layer to be provided in the first blue-displaying pixel 13, the organic light emitting layer 19c with the third emission spectrum is formed.

Furthermore, the cathode electrode 20 is formed so as to cover the electron-transport layer 33. As the material for the cathode electrode 20, a material, such as magnesium-silver alloy, may be used. Furthermore, the protective film 34 is formed so as to cover the whole. In this manner, pixels of the organic EL display can be formed.

Figure 10A:
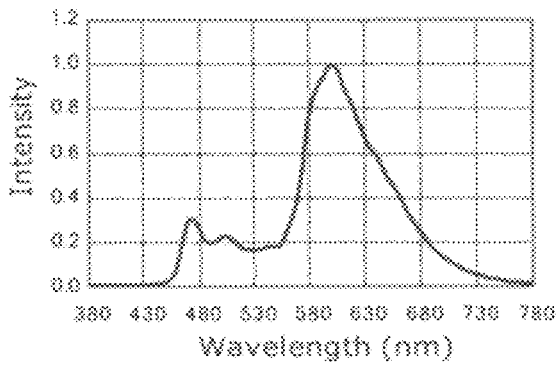
FIGS. 10A to 10C illustrate the light emission spectra of organic light emitting layers of the organic EL display according to the second embodiment.
Figure 10B:
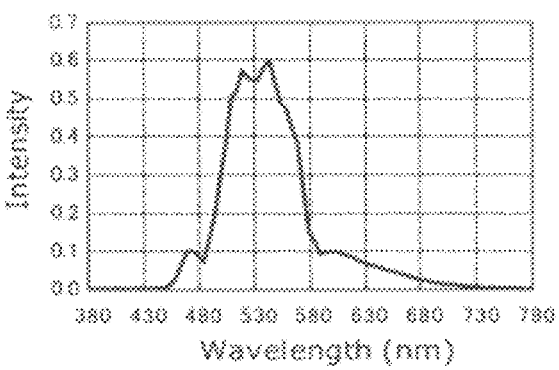
Figure 10C:
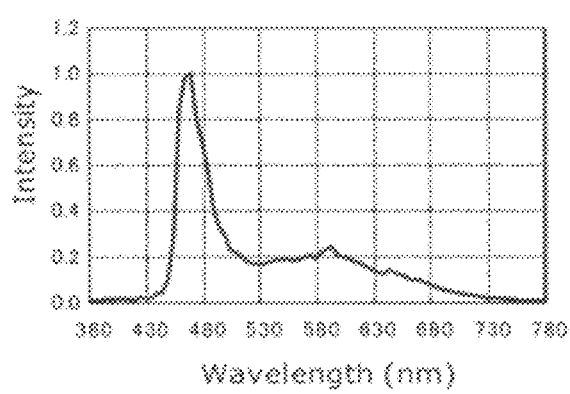
Figure 11:
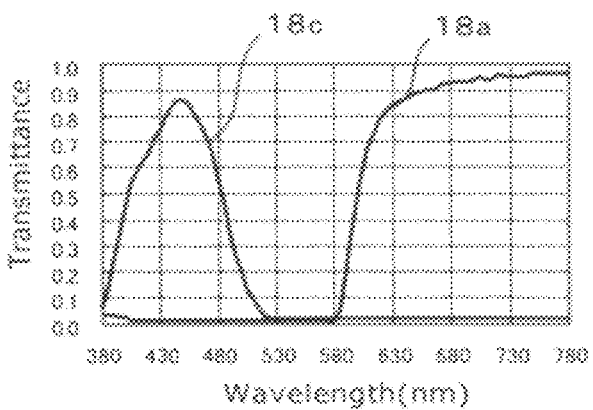
FIG. 11 illustrates the transmission spectra of color filters of the organic EL display according to the second embodiment.

The first emission spectrum of the organic light emitting layer 19a is illustrated in FIG. 10A, the second emission spectrum of the organic light emitting layer 19b is illustrated in FIG. 10B, and the third emission spectrum of the organic light emitting layer 19c is illustrated in FIG. 10C. The transmission spectra of the color filters are illustrated in FIG. 11.

Because there is no color filter in the second red-displaying sub-pixel 15a, the green-displaying sub-pixel 114b, and the second blue-displaying sub-pixel 15c, luminescence from the three sub-pixels are determined by the first emission spectrum, the second emission spectrum, and the third emission spectrum, respectively. The peak wavelengths of the first emission spectrum, the second emission spectrum, and the third emission spectrum are represented by points 15a, 114b and 15c each surrounded by a circle in a CIE1931xy chromaticity diagram illustrated in FIG. 13, respectively. The range surrounded by a triangle made by connecting the three points and illustrated by a solid line can be displayed only by combination of luminescence from the second red-displaying sub-pixel 15a, the green-displaying sub-pixel 114b, and the second blue-displaying sub-pixel 15c, each having no color filter. For this reason, reduction in light use efficiency due to the color filters does not arise in the display of pale colors in this region.

Figure 12:
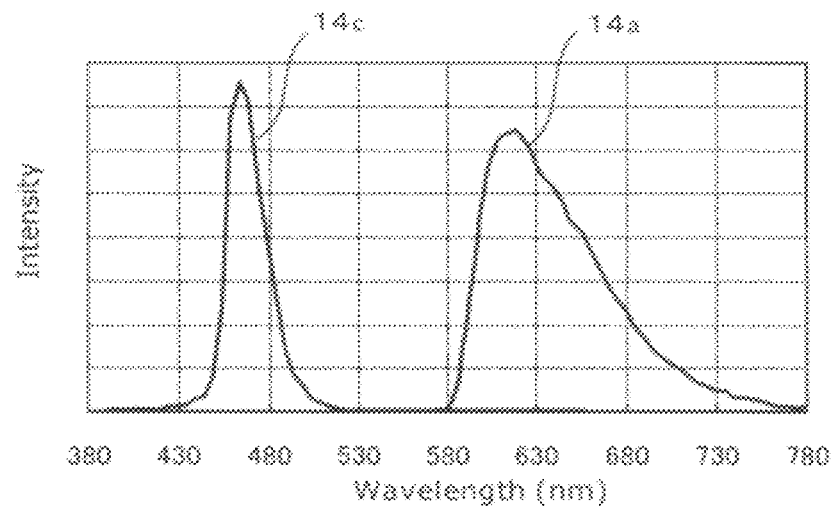
FIG. 12 illustrates the light spectra of the organic EL display according to the second embodiment transmitted a first red-displaying sub-pixel and a first blue-displaying sub-pixel.
Figure 13:
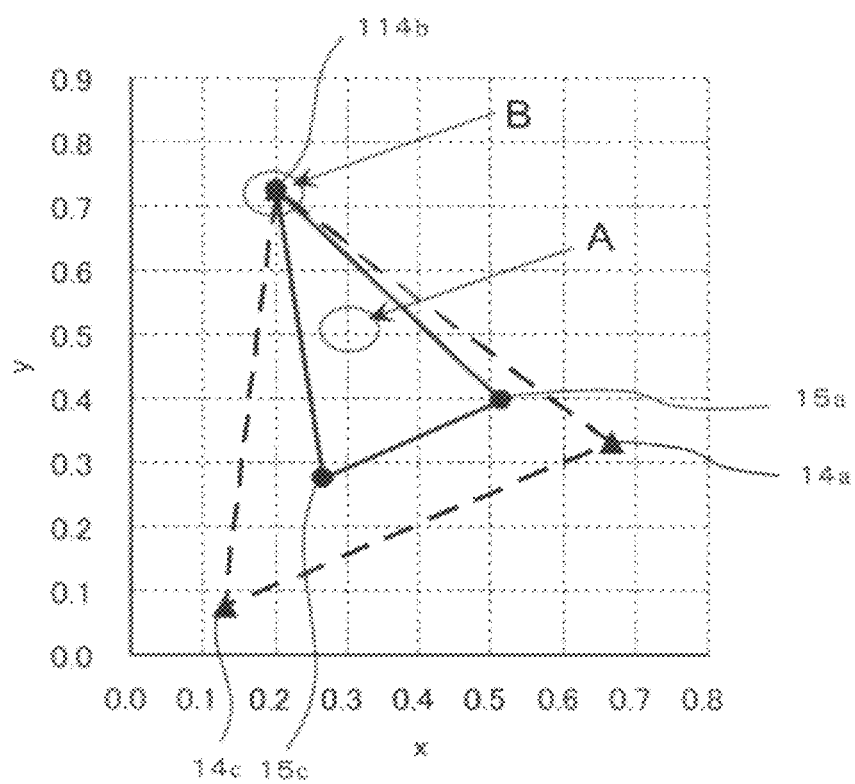
FIG. 13 illustrates the coordinate of the light spectrum from each of the sub-pixels of the organic EL display according to the second embodiment in a CIE1931xy chromaticity diagram.

On the other hand, the first red-displaying sub-pixel 14a and the first blue-displaying sub-pixel 14c use light of the first emission spectrum and light of the third emission spectrum, after transmitted by each color filter, respectively, and the spectra become as illustrated in FIG. 12. The coordinates of the first red-displaying sub-pixel 14a and the first blue-displaying sub-pixel 14c in the CIE1931xy chromaticity diagram of the spectrum indicate points 14a and 14c each surrounded by a triangle as illustrated in FIG. 13. The size of a triangle made by connecting the three points of 14a, 14c, and 114b of the second emission spectrum of the green-displaying sub-pixel 114b and illustrated by a dashed line is larger than that of the triangle illustrated by a solid line. As for display colors present outside the triangle illustrated by a solid line and present inside the triangle illustrated by a dotted line, colors may be reproduced by utilizing luminescence from the first red-displaying sub-pixel 14a, the green-displaying sub-pixel 114b and the first blue-displaying sub-pixel 14c, and thereby a large color reproduction range can be achieved.

Even if a material emitting light having a spectrum in the range of A illustrated in FIG. 13, or a material emitting light having a spectrum in the range of B is selected as a material of the green organic light emitting layer 19b, quantum efficiency of a green color does not change largely. Therefore, such a green-displaying sub-pixel can display a deep color without providing a color filter.

By adopting such a structure, when displaying a color inside the triangle illustrated by a solid line, it is possible to combine luminescence from a plurality of light emitting layers each having an emission spectrum with a different color coordinate, and thereby decrease in the light use efficiency due to color filters does not arise. Moreover, in cases of blue and red, since a large color reproduction range can be achieved by using the sub-pixels combined with each color filter, it is possible to display a color present outside the triangle illustrated by a solid line and present inside the triangle illustrated by a dotted line. When displaying contents in which generation frequency of white color or pale colors is high and deep colors are also contained, the pale colors can be displayed in a high efficiency, enabling to reduce power consumption in a display in which many pale colors are displayed. Moreover, since the amount of current for displaying the same luminosity can be reduced, a degradation phenomenon in which the luminous efficiency decreases with time can be suppressed.

Third Embodiment

Figure 14:
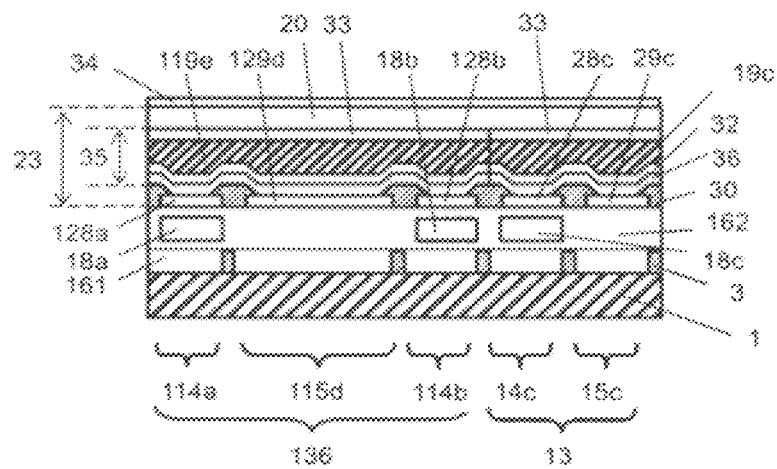
FIG. 14 is a partial cross-sectional view of an organic EL display according to a third embodiment.
Figure 15:
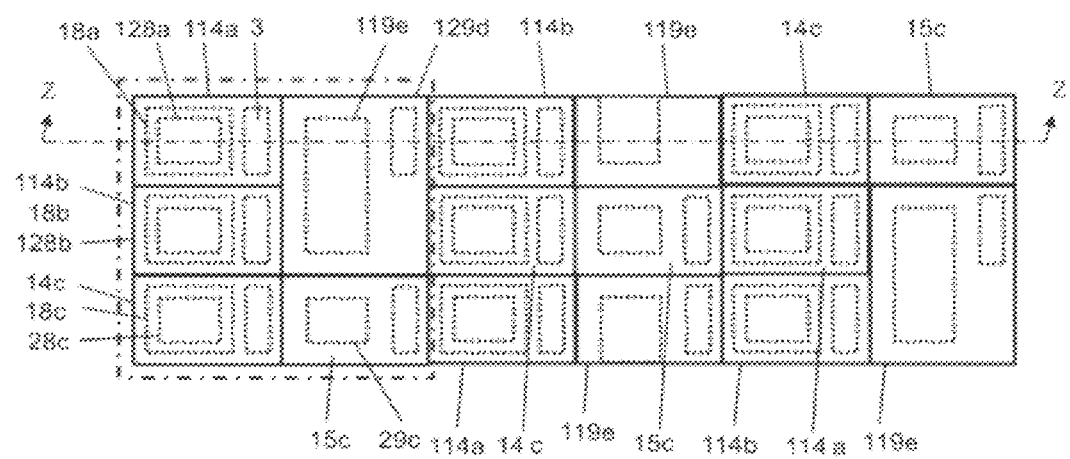
FIG. 15 is a partial plan view of the organic EL display according to the third embodiment.

Next, with reference to the drawings, an organic EL display according to a third embodiment will be described. In the organic EL display of the embodiment, a plurality of pixels is arranged in a matrix, and one pixel includes five sub-pixels. A partial cross-sectional view and a plan view of the organic EL display are illustrated in FIG. 14 and FIG. 15, respectively. FIG. 14 is a cross-sectional view along line Z-Z of FIG. 15.

That is, one pixel has a red/green-displaying portion 136 and a blue-displaying portion 13. The red/green-displaying portion 136 has a red-displaying sub-pixel 114a and a red/green-displaying sub-pixel 115a. The blue-displaying portion 13 has a first blue-displaying sub-pixel 14c and a second blue-displaying sub-pixel 15c. In the upper layer of the red-displaying sub-pixel 114a, a color filter 18a mainly transmitting red light is provided. In the upper layer of the green-displaying sub-pixel 114b, a color filter 18b mainly transmitting green light is provided. In the upper layer of the first blue-displaying sub-pixel 14c, a color filter 18c mainly transmitting blue light is provided.

In the upper layer of the red/green-displaying portion 136, an organic light emitting layer 119e with a fourth emission spectrum emitting red/green light is further provided. In the upper layer of the blue-displaying portion 13, an organic light emitting layer 19c with a third emission spectrum emitting blue light is provided. Other configurations are the same as those in the first embodiment, and thereby detailed description thereof will be omitted.

An example of a method for manufacturing such an organic EL display is as follows. That is, on a transparent insulating substrate 1, a circuit as represented by the equivalent circuit in FIG. 3 including a thin film transistor (TFT) array in which pixels are formed in a matrix is formed. As the insulating substrate 1, an alkali-free-glass substrate and a plastic film of, such as PEN, may be used. Moreover, as for the TFTs, materials, such as low-temperature polysilicon, amorphous silicon, and an oxide semiconductor, may be used for a channel layer, but the materials are not limited thereto. Each pixel includes a red/green-displaying portion 136 and a blue-displaying portion 13, and the red/green-displaying portion 136 and the blue-displaying portion 13 include three sub-pixels, and two sub-pixels, respectively. That is, in the example, one pixel includes five sub-pixels.

The equivalent circuit diagram of the pixel circuit 3 of a sub-pixel is illustrated in FIG. 3. In one sub-pixel, a storage capacitor 27, a switching TFT 21 for writing a display signal in the storage capacitor 27, an organic EL structure 23, and a driving TFT 22 connected in series with the organic EL structure 23 and controlling the amount of current flowing into the organic EL structure 23 are formed. Although a circuit configuration including two TFTs in one sub-pixel is described here, a circuit including three or more TFTs may be used.

An example of a method for manufacturing an organic EL display having such pixels will be described.

First, the above-mentioned pixel circuit 3 is formed on the substrate. On the pixel circuit 3, a first planarization layer 161 made of a transparent resin is formed. Subsequently, the red color filter 18a, the green color filter 18b and the blue color filter 18c are formed one by one in the first red-displaying sub-pixel 114a that is one of sub-pixels of the green/red-displaying portion 136, the first green-displaying sub-pixel 14b that is one of sub-pixels of the green/red-displaying portion 136, and the first blue-displaying sub-pixel 14c that is one of sub-pixels of the blue-displaying portion 13, respectively, by a photolithography process. For each of the color filters, a resin containing a pigment or a photosensitive material corresponding to its transmission spectrum may be used, and it is formed to have a film thickness of 1 to 2 μm. At that time, none of the color filters is formed in the green red-displaying sub-pixel 115d that is one of sub-pixels of the green/red-displaying portion 136 and the second blue-displaying sub-pixel 15c that is one of sub-pixels of the blue-displaying portion 13.

Subsequently, a second planarization layer 162 made of a transparent organic resin is formed on the whole surface, and the unevenness of the substrate surface generated due to formation of the color filters is planarized. The second planarization layer 162 is also formed on the green/red-displaying sub-pixel 115a and the second blue-displaying sub-pixel 15c, in which no color filter is provided. At this time, the height of each sub-pixel is almost equivalent.

Subsequently, pixel electrodes 128a, 129d, 128b, 28c, and 29c each made of a transparent conductive film are formed in all of the sub-pixels. The pixel electrodes 128a, 129d, 128b, 28c, and 29c function as the anode electrodes of the organic EL structure 23, and they may be formed of a film, such as an ITO film, an ITO/silver/ITO stacked film with a film thickness of about 100 nm. The pixel electrode 128a of the red-displaying sub-pixel 114a, the pixel electrode 128b of the green-displaying sub-pixel 114b, and the pixel electrode 28c of the first blue-displaying sub-pixel 14c are arranged so as to overlap with the red color filter 18a, the green color filter 18b, and the blue color filter 18c, respectively.

Subsequently, the banks 30 are formed so as to cover the end portions of the pixel electrodes 128a, 129d, 128b, 28c, and 29c. For the banks 30, resins, such as polyimide and acrylic, may be used, and they can be formed of a photosensitive material to have a film thickness of about 0.2 to 2 μm by the photolithography process.

Subsequently, in the red-displaying sub-pixel 114a, the green-displaying sub-pixel 114b and the green/red-displaying sub-pixel 115d, the hole-injection layer 36, the hole-transport layer 32, the organic light emitting layer 19a with the fourth emission spectrum, and the electron-transport layer 33 are formed one by one. As the formation method, mask deposition and printing by ink-jetting can be used. As materials for the hole-injection layer 36, the hole-transport layer 32, and the electron-transport layer 34, materials such as DNTPD (N,N'-[p-di(m-tolyl) aminophenyl]-N,N'-diphenyl bendizine), and F4-TCNQ, materials such as NPB (Napthylphenylbiphenyl), and TPD derivative ([{(Ph-Ph) 2N-Ph-}2]), a material such as Alq3 may be used, respectively, but the materials are not limited thereto. If necessary, a hole-injection layer and an electron-injection layer may be formed. As for the organic light emitting layer 19a with the fourth emission spectrum, a dopant material, such as diphenylquinoxaline-Iridium compound, and a host material, such as Alq3 (Tris-(8-hydroxyquinoline) aluminum), may be used, but the materials are not limited thereto.

Similarly, in the first blue-displaying sub-pixel 14c and the second blue-displaying sub-pixel 15c, the hole-injection layer 36, the hole-transport layer 32, the organic light emitting layer 19c with the third emission spectrum, and the electron-transport layer 33 are stacked.

Furthermore, the cathode electrode 20 is formed so as to cover the electron-transport layer 33. As the material for the cathode electrode 20, a material, such as magnesium-silver alloy, may be used. Furthermore, the protective film 34 is formed so as to cover the whole. In this manner, a bottom emission type organic EL display extracting light from the side of the insulating transparent substrate 1 can be formed.

Figure 16A:
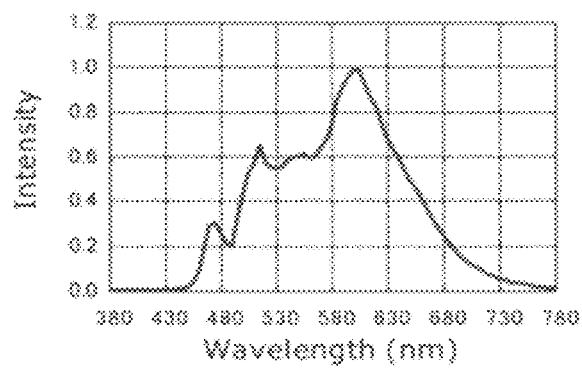
FIGS. 16A and 16B illustrate the light emission spectra of organic light emitting layers of the organic EL display according to the third embodiment.
Figure 16B:
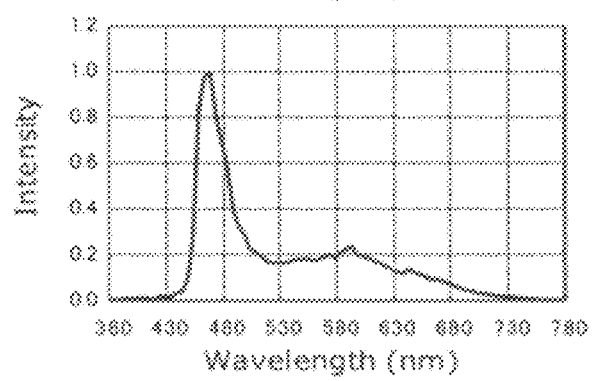
Figure 17:
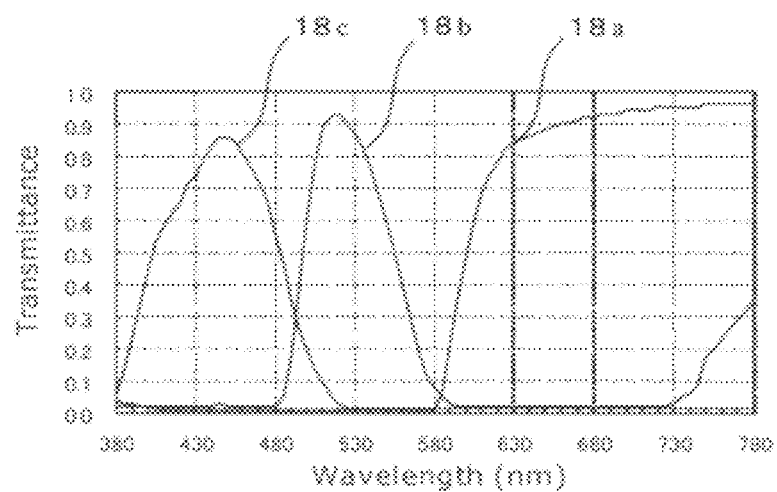
FIG. 17 illustrates the transmission spectra of color filters of the organic EL display according to the third embodiment.

Here, the light emission spectra of the organic light emitting layer 119e with the fourth emission spectrum and the organic light emitting layer 19c with the third emission spectrum are illustrated in FIGS. 16A and 16B, and the transmission spectra of the color filters are illustrated in FIG. 17. The emission spectrum of the organic light emitting layer 119c is illustrated in FIG. 16A, and the emission spectrum of the organic light emitting layer 19c is illustrated in FIG. 16B.

Figure 19:
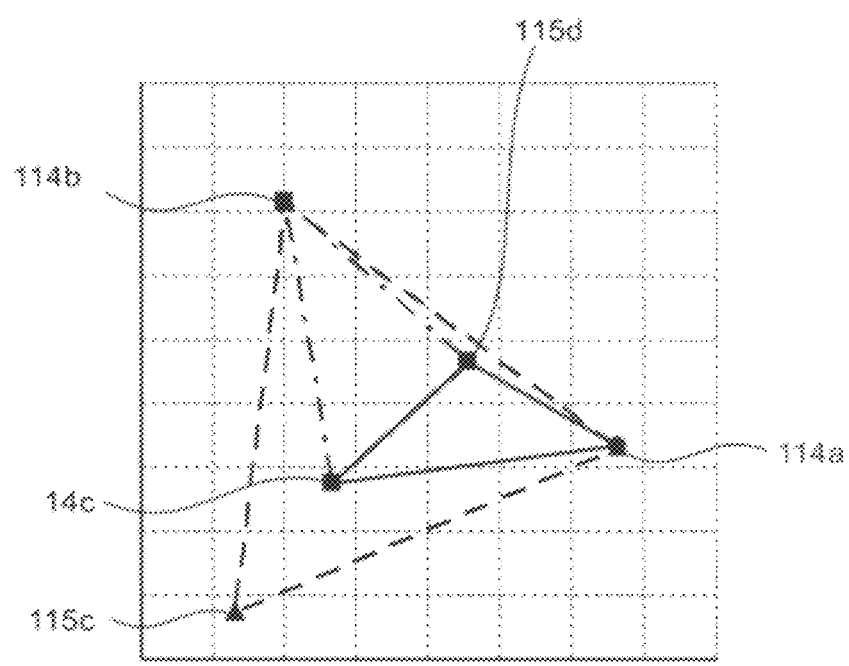
FIG. 19 illustrates the coordinate of the light spectrum from each of the sub-pixels of the organic EL display according to the third embodiment in a CIE1931xy chromaticity diagram.

Because there is no color filter in the red/green-displaying sub-pixel 115d and the second blue-displaying sub-pixel 15c, luminescence from the three sub-pixels are determined by the fourth emission spectrum and the third emission spectrum, respectively. The coordinates of the peak wavelengths of the fourth emission spectrum and the third emission spectrum in the CIE1931xy chromaticity diagram indicate points A' and B' illustrated in FIG. 19, respectively.

Figure 18:
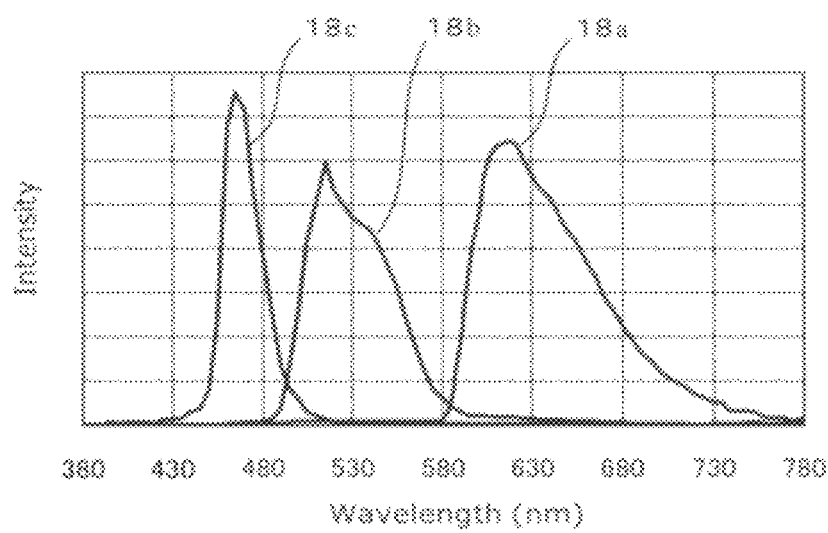
FIG. 18 illustrates the light spectra of the organic EL display according to the third embodiment transmitted a red-displaying sub-pixel, a green-displaying sub-pixel, and a first blue-displaying sub-pixel.

Moreover, the red display sub-pixel 114a, the green-displaying sub-pixel 114b and the first blue display sub-pixel 14c use light after transmitted by each color filter, respectively, and the spectra are illustrated in FIG. 18 and indicate points C, D and E in the xy chromaticity-coordinates system, respectively.

That is, in order to express colors in the range surrounded by triangle A'B'C, only the second blue-displaying sub-pixel 15c, the green/red-displaying sub-pixel 115d and the red-displaying sub-pixel 114a should emit light, and, in order to express colors in the range surrounded by triangle A'B'D, only the second blue-displaying sub-pixel 15c, the green/red-displaying sub-pixel 115d and the green-displaying sub-pixel 114b should emit light. For this reason, when displaying colors in the range surrounded by triangle A'B'C or triangle A'B'D, decrease in the light use efficiency due to a color filter is small. In the range near line A'B', since luminescence of the red-displaying sub-pixel 114a or the green-displaying sub-pixel 114b may be weak, decrease in the light use efficiency due to a color filter can be suppressed to be smaller.

In order to display colors in a range present inside a triangle surrounded by points 114a, 114b and 14c and present outside the triangle A'B'C or the triangle A'B'D, it is necessary to emit light two or more sub-pixels out of the red-displaying sub-pixel 114a, the green-displaying sub-pixel 114b and the first blue-displaying sub-pixels 14c, each is a sub-pixel in which a color filter is formed, resulting in low light use efficiency, but, a large color reproduction range can be achieved.

By adopting such a structure, when displaying a pale color, it is possible to combine luminescence from a plurality of light emitting layers each having an emission spectrum with a different color coordinate, and thereby decrease in the light use efficiency due to color filters can be suppressed. Moreover, since a large color reproduction range can be achieved by using the sub-pixels combined with each color filter, it is also possible to display a deep color. When displaying contents in which generation frequency of white color or pale colors is high and deep colors are also contained, the pale colors can be displayed in a high efficiency, enabling to reduce power consumption in a display in which many pale colors are displayed. Moreover, since the amount of current for displaying the same luminosity can be reduced, a degradation phenomenon in which the luminous efficiency decreases with time can be suppressed.

Fourth Embodiment

Figure 20:
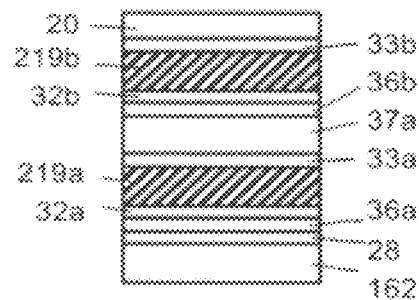
FIG. 20 is an enlarged cross-sectional view illustrating an organic light emitting layer of an organic EL display according to a fourth embodiment.

In the embodiment, an organic EL display including a so-called stacked structure in which a plurality of organic EL layers are vertically stacked, will be described. FIG. 20 and are enlarged partial cross-sectional views illustrating a configuration in which two organic EL layers are stacked and a configuration in which three organic EL layers are stacked, respectively. Each of the organic EL displays includes: a second planarization layer 162; a pixel electrode 28 provided on the second planarization layer 162; a plurality of organic EL layers provided on the pixel electrode 28; and a cathode electrode 20 provided on the organic EL layers.

In the organic EL layer illustrated in FIG. 20, a first hole-injecting layer 36a, a first hole-transport layer 32a, an organic light emitting layer 219a, a first electron-transport layer 33a, a first charge-generation layer 37a, a second hole-injecting layer 36b, a second hole-transport layer 32b, an organic light emitting layer 219b and a second electron-transport layer 33b are provided from a side proximal to the pixel electrode 28.

Figure 21:
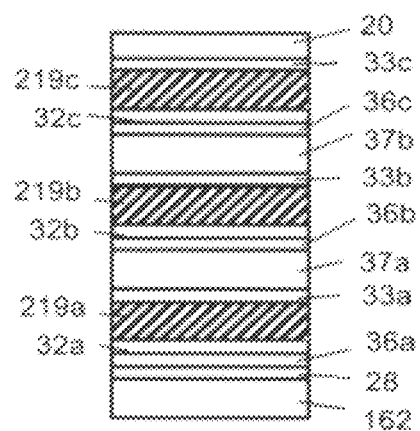
FIG. 21 is an enlarged cross-sectional view illustrating an organic light emitting layer of another organic EL display according to the fourth embodiment.

In the organic EL layer illustrated in FIG. 21, a second electron-charge-generation layer 37b is provided on a second electron-transport layer 33b, and a third hole-injecting layer 36c, a third hole-transport layer 33c, an organic light emitting layer 219c and a third electron-transport layer 33c are stacked on the second electron-charge-generation layer 37b.

Other configurations are the same as those in the first embodiment, and thereby detailed description thereof will be omitted.

Light emission spectra of the organic light emitting layers 219a, 219b and 219c differ from each other. For example, in the case of two organic light emitting layers, the organic light emitting layer 219a near the pixel electrode 28 emits blue light, and the other organic light emitting layer 219b emits red light. Such an organic EL layer, by combining light of the two organic light emitting layers, emits white light, such as white light containing a lot of blue components, white light containing a lot of green components and white light containing a lot of red components. Luminescent color can be adjusted by changing the amount of dopant materials contained in the organic light emitting layers 219a, 219b and 219c. Accordingly, light emission spectra may be changed by forming the red display portion, the green display portion and the blue display portion with a single material and changing the amount of the dopant materials.

In the case where such an organic EL layer is used for the organic EL display of the first embodiment, the organic EL layer is formed into two sub-pixels, and one of them is provided with a color filter and the other is not provided with a color filter. For example, the organic EL layer emits white light containing a lot of blue components, and one of the sub-pixels having the organic EL layer is provided with a color filter transmitting blue light. The other sub-pixel not provided with a color filter can display a pale blue color in a high efficiency. Moreover, the sub-pixel provided with the color filter can display a deep blue color.

In the case where a three-layer organic EL layer is formed as illustrated in FIG. 21, for example, among the three layers, an organic light emitting layer 219a near the pixel electrode 28 emits blue light, an organic light emitting layer 219b at the center emits green light, and an organic light emitting layer 219c near the cathode electrode 20 emits red light.

An example of a method for manufacturing such an organic EL layer is as follows. That is, the first hole-injection layer 36a, the first hole-transport layer 32a, the organic light emitting layer 219a with a first emission spectrum, and the first electron-transport layer 33a are formed one by one on the pixel electrode 28, and then the first charge-generation layer 37a is formed thereon.

Subsequently, the second hole-injection layer 36b, the second hole-transport layer 32b, the organic light emitting layer 19b with a second emission spectrum, and the second electron-transport layer 33b are formed one by one on the first charge-generation layer 37a, and then the second charge-generation layer 37b is formed thereon.

Subsequently, in the case where the three-layer organic EL layer as illustrated in FIG. 21 is formed, the third hole-injection layer 36c, the third hole-transport layer 32c, the organic light emitting layer 19c with a third emission spectrum, and the third electron-transport layer 33c are formed one by one on the second charge-generation layer 37b.

In the case of two-layer organic EL layer, the cathode electrode 20 is formed on the second electron-transport layer 33b, and in the case of three-layer organic EL layer, the electrode 20 is formed on the third electron-transport layer 33c.

With regard to a part of a plurality of layers constituting the stacked OLED layer, a single layer may be used by different sub-pixels. Moreover, in an organic light emitting layer having different sub-pixels, emission spectra from the sub-pixels may be controlled by changing the concentration or the kind of a dopant material while using a common host material.

Thus, by making the organic EL layer into a stacked structure, the same effect as the first embodiment can also be obtained. In addition, it is also possible to form an organic EL layer including a multiple-layers stacked structure of four or more layers.

COMPARATIVE EXAMPLE 1

Figure 22:
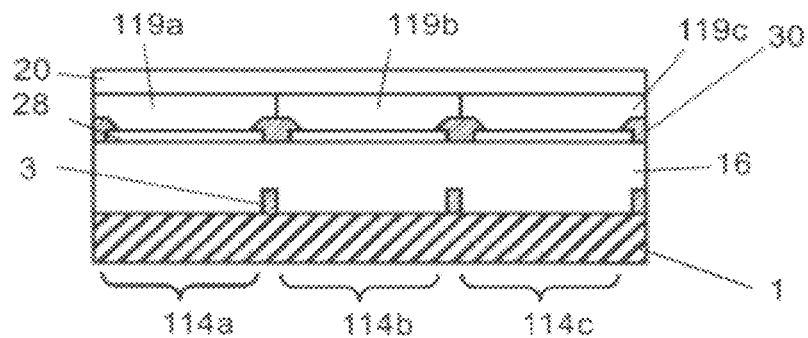
FIG. 22 is a partial cross-sectional view illustrating an organic EL display of Comparative Example 1.

FIG. 22 illustrates a pixel cross-sectional structure of an organic EL display of Comparative Example 1. Each pixel includes a red-displaying sub-pixel 114a, a green-displaying sub-pixel 114b and a blue-displaying sub-pixel 114c, and the sub-pixels have an organic red-light-emitting layer 119a, an organic green-light-emitting layer 119b and an organic blue-light-emitting layer 119c, respectively. None of the sub-pixels is provided with a color filter. On a planarization layer 16 covering a pixel circuit 3, a pixel electrode 28 is formed. Other configurations are the same as those in the first embodiment, thereby; detailed description thereof will be omitted.

Figure 23:
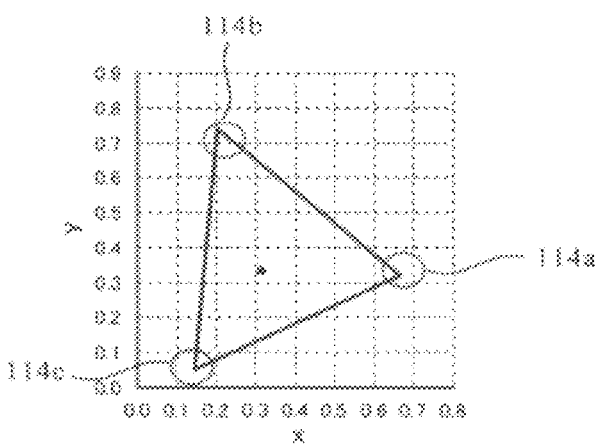
FIG. 23 is an xy chromatic coordinate illustrating the light emission spectrum of each sub-pixel of the organic EL display of Comparative Example 1 in a CIE1931xy chromaticity diagram.

In such a structure, the color reproduction range is determined by the emission spectra of R, G and B organic light emitting layers 119a, 119b, and 119c. In FIG. 23, a CIE1931xy chromaticity diagram and coordinates of the light-emission spectra of the organic red-light-emitting layer 119a, the organic green-light-emitting layer 119b and the organic blue-light-emitting layer 119c are illustrated. Such an organic EL display can reproduce only the inside of a triangle formed with the color coordinates determined by the R, G and B emission spectra. In FIG. 23, the peak wavelengths of the organic red-light-emitting layer 119a, the organic green-light-emitting layer 119b and the organic blue-light-emitting layer 119c are expressed by 114a, 114b and 114c, respectively. That is, in order to reproduce a large color gamut by a display, it is necessary for the points on the CIE1931xy chromaticity diagram determined by the R, G and B emission spectra to be in end portions of the chromaticity diagram, respectively. For example, in order to display a blue color, only B should be emitted, and in order to display a white or whity pale color, it is necessary to emit R, G and B.

Figure 24:
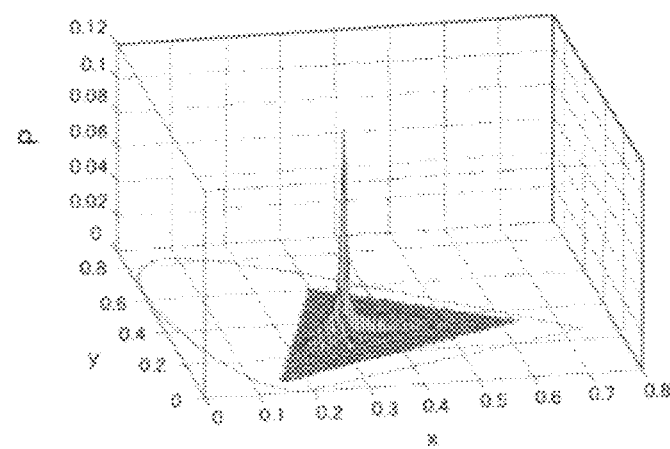
FIG. 24 illustrates an example of generation frequency of color in an actual video signal.

FIG. 24 displays the example of generation frequency of each color in an actual video signal as a histogram on color coordinates, and it is understood that there are many displays of pale colors indicating the center of the color coordinates. In general, luminous efficiency of a blue or red color is lower than those of pale colors, in special as for the blue color, as the purity becomes higher, that is, values of the x and y coordinates become smaller in the color coordinates, the luminous efficiency becomes smaller. For this reason, if the purity of R or B is made high to achieve a large color reproduction range, luminous efficiency when displaying pale colors with high generation frequency may be small.

COMPARATIVE EXAMPLE 2

Figure 25:
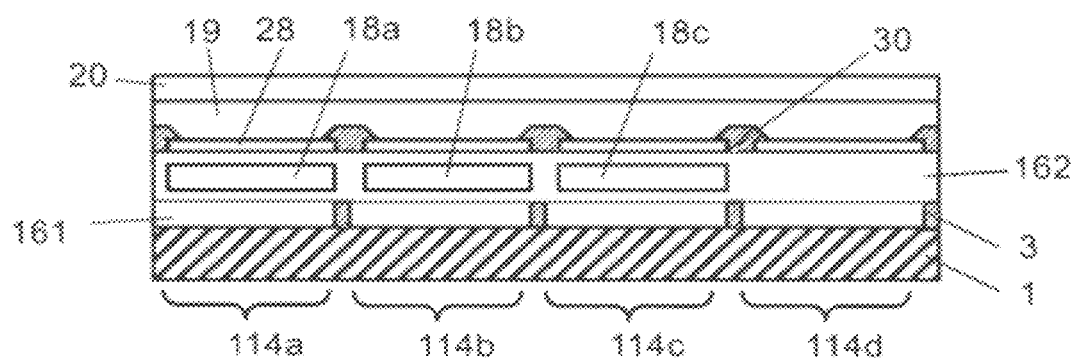
FIG. 25 is a partial cross-sectional view illustrating an organic EL display of Comparative Example 2.

FIG. 25 illustrates a pixel cross-sectional structure of an organic EL display of Comparative Example 2. Each pixel includes a red-displaying sub-pixel 114a, a blue-displaying sub-pixel 114c and a white-displaying sub-pixel 114d. An organic light emitting layer 19 uses a white OLED material containing wavelengths of red, green and blue. A red color filter 18a, a green color filter 18b and a blue color filter 18c are formed in the red-displaying sub-pixel 114a, the green-displaying sub-pixel 114b, and the blue-displaying sub-pixel 114c, respectively. Such a system can reproduce only the inside of a triangle formed with the color coordinates determined by spectrum after transmitted by the R, G and B color filters. In the case where display is carried out using light transmitted by the color filters, luminous efficiency is small during displaying a high purity color, because only a part of light emitted within a large wave length range is utilized, but luminous efficiency during displaying a white color is higher than that of the first OLED display, because light of the W sub-pixel can be utilized. In order to display a pale color, the W sub-pixel is emitted as much as possible, and only insufficient parts are compensated with R, G and B sub-pixels. For example, in order to display a pale red color, since only the W and R sub-pixels should be emitted and the G and B sub-pixels should not be emitted, light emission from the W sub-pixel can be effectively utilized, which is not transmitted by a color filter. However, utilization of light emission from the R, G and B may decrease efficiency due to color filters.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. An organic electroluminescent display comprising:
 a substrate; and
 a pixel disposed on the substrate and including a first color displaying portion, a second color displaying portion, and a third color displaying portion, the first color dis- playing portion having a first organic light emitting layer, the second color displaying portion having a second organic light emitting layer having an emission spectrum different from an emission spectrum of the first organic light emitting layer, the third color displaying portion having a third organic light emitting layer having an emission spectrum different from the emission spectrum of the first organic light emitting layer and the emission spectrum of the second light emitting layer, wherein each of the first color displaying portion, the second color displaying portion, and the third color displaying portion has a first sub-pixel provided with a color filter and a second sub-pixel provided with no color filter, and wherein in the first color displaying portion, the second color displaying portion, and the third color displaying portion, a color gamut reproduced by said three first sub-pixels, each provided with said color filter, is larger than a color gamut reproduced by said three second sub-pixels, each provided with no color filter.

2. The organic electroluminescent display according to claim 1, wherein the color filter transmits light in a wavelength range narrower than a wavelength range of a light spectrum of a light emitting layer provided in the same sub-pixel provided with the color filter.

3. The organic electroluminescent display according to claim 1, wherein the first color displaying portion, the second color displaying portion and the third color displaying portion are one of a red-displaying portion, a green-displaying portion and a blue-displaying portion, respectively.

* * * * *